United States Patent
Grodnensky et al.

(10) Patent No.: US 6,323,938 B1
(45) Date of Patent: Nov. 27, 2001

(54) METHOD OF CHARACTERIZING PHOTOLITHOGRAPHIC TOOL PERFORMANCE AND PHOTOLITHOGRAPHIC TOOL THEREOF

(75) Inventors: Ilya Grodnensky, Foster City; Toshihiro Sasaya, San Mateo, both of CA (US)

(73) Assignee: Nikon Precision, Inc., Belmont, CA (US)

( * ) Notice: Subject to any disclaimer, the term of this patent is extended or adjusted under 35 U.S.C. 154(b) by 0 days.

(21) Appl. No.: 09/067,309

(22) Filed: Apr. 27, 1998

(51) Int. Cl.[7] ............................ G03B 27/32; G03B 27/42; G03B 11/00
(52) U.S. Cl. ........................ 355/77; 355/53; 356/399
(58) Field of Search .................. 355/43, 45, 53, 355/77; 356/399, 400, 401, 384, 387, 124, 127; 250/548

(56) References Cited

U.S. PATENT DOCUMENTS

| | | | |
|---|---|---|---|
| 4,639,142 | * 1/1987 | Chow et al. | 355/53 |
| 4,908,656 | 3/1990 | Suwa et al. | 355/53 |
| 4,939,630 | 7/1990 | Kikuchi et al. | 362/268 |
| 5,335,044 | 8/1994 | Shiraishi | 355/53 |
| 5,402,224 | * 3/1995 | Hirukawa et al. | 355/77 |
| 5,615,047 | 3/1997 | Komatsuda et al. | 359/618 |
| 5,835,227 | * 11/1998 | Grodnensky et al. | 356/399 |

OTHER PUBLICATIONS

Ilya M. Grodnensky, "Characterization of spatial coherence uniformity in exposure tools," SPIE Conf., Feb. 1998. 5 pp.

\* cited by examiner

Primary Examiner—Russell Adams
Assistant Examiner—Peter B. Kim
(74) Attorney, Agent, or Firm—Skjerven Morrill MacPherson LLP; Norman R. Klivana; Mark E. Schmidt

(57) ABSTRACT

A method of characterizing photolithographic tool performance is presented. Variations in performance over an image or exposure field are evaluated and contributions to the variation due to the partial coherence factor of the tool separated from other contributing factors. Methods of determining the relative magnitude of these variations is provided and a photolithographic tool that incorporates these methods described.

5 Claims, 3 Drawing Sheets

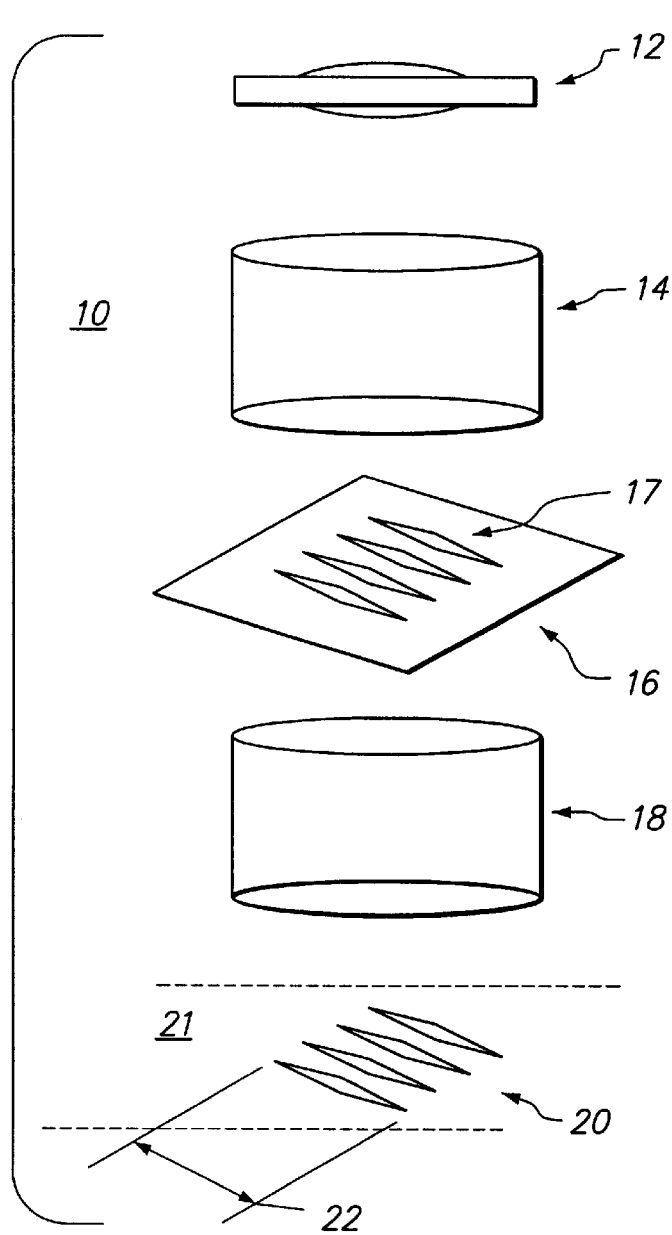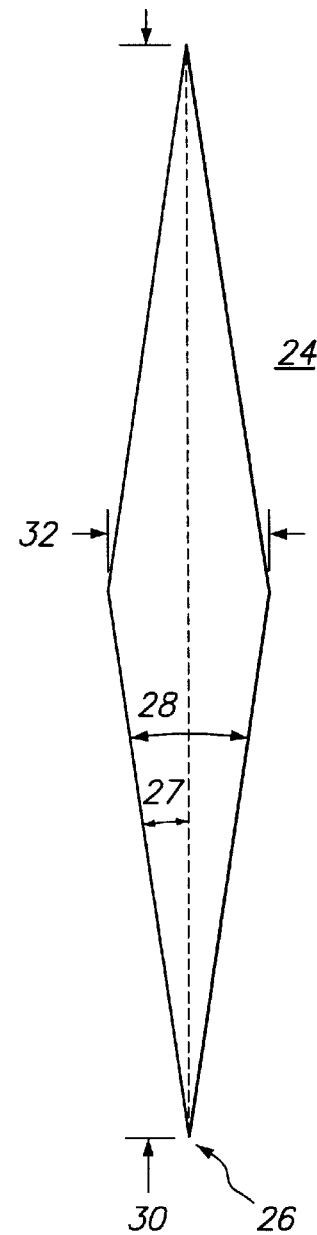
FIG. 1  FIG. 2

METHOD OF CHARACTERIZING PHOTOLITHOGRAPHIC TOOL PERFORMANCE AND PHOTOLITHOGRAPHIC TOOL THEREOF

BACKGROUND

1. Field of the Invention

The present invention relates generally to characterizing the performance of photolithography tools and more particularly to a method of determining the relative contribution of a photolithography tool's illumination optics and projection optics to across field line-width variation.

2. Related Art

Manufacturers of photolithography systems and in particular projection exposure systems are constantly striving to produce systems capable of creating semiconductor and other devices having the smallest possible line-widths. The line-width is a determining factor in the density which can be achieved in, for example, forming an integrated circuit (IC). As IC circuitry becomes more advanced, a greater number of circuit elements is typically required. Exposure systems must be capable of forming a greater density of circuit elements to avoid increasing the size of the IC. In addition to circuit density, smaller line-widths are also required for lower voltage operations and are desired to increase the speed at which the ICs operate.

Projection exposure system resolution is controlled by several factors, including the wavelength of light used to provide illumination for the exposure system, the numerical aperture of the projection lens or optical system ($NA_{p1}$), and the coherence of the light from the light source. Those skilled in the art will appreciate that there is a trade-off between the maximum achievable resolution and the usable depth of focus in a lithographic system. In the case were an image needs to be reproduced on a given topography, the usable depth of focus can be a more significant factor to the user of the system than the achievable resolution. If the image cannot be reproduced on a given topography due to depth of focus limitations, the theoretical maximum achievable resolution will mean little to the user of the system. Thus, the usable depth of focus can often determine the overall performance of the lithographic system. Between the maximum achievable resolution and the depth of focus, there is generally an optimum trade-off point. The maximum resolution and depth of focus characteristics will combine to determine if a system is suitable for the image which is to be projected.

In addition to the projection lens system, projection exposure systems also include an illumination optical system having a numerical aperture $NA_{i11}$. The illumination optics, which may include a lens, mirror, or other suitable optical element, receives the light from the projection system's light source and illuminates the mask or reticle to produce the image which is then focused by the projection lens or optical system onto an image plane where a substrate being subjected to the lithography process is placed. The ratio of the numerical aperture of the illumination optics to that of the projection lens or optical system ($NA_{i11}/NA_{p1}$) is called the partial coherence factor (PCF), or sigma ($\sigma$). It is known that the exact size of the projected image, depth of focus, and contrast across the image plan depend strongly on PCF and that PCF varies across the exposure field. Thus, the values of PCF or $\sigma$ found at various locations in the exposure field are not constant and can exhibit variation of as much as 10%.

The variation in PCF at the various locations in the exposure field, among other things, is known to contribute to variation in line widths or critical dimensions within the exposure field. This variation, commonly referred to as Across Chip Line-width Variation (ACLV) is also an important factor in determining a photolithographic tool's performance. Thus where typical design rules for fabrication of a semiconductor device require ACLV to be in the range of no greater than approximately ±10% of the nominal critical dimension for that device, such variations in excess of this amount can prevent a tool from achieving the needed results, thus interfering with production. It will be understood that for some applications ACLV variation of less than 10% can be desirable for microelectronic production.

In the related application entitled "METHOD AND APPARATUS FOR DETERMINING PARTIAL COHERENCE FACTOR IN LITHOGRAPHIC TOOLS", Ser. No. 08/818,375, (hereinafter '375) incorporated herein by reference, a method and apparatus which allows for rapid and reproducible measurements of variations in PCF or $\sigma$ across the image plane or exposure field in optical projection and lithography systems was presented. This method and apparatus was shown to be insensitive to other parameters or uncontrollable characteristics such as optical aberrations, defocus, exposure energy, photoresist properties or process conditions and advantageous with respect to previously known methods and systems.

Accordingly, to advantageously employ the method and apparatus of the above referenced application, there is a clear need for a method for determining the relative contribution of illumination and projection optics to across field line-width variations by making use of the PCF measurements obtained.

SUMMARY

The present invention provides a fast, economical and reliable technique for characterizing the performance of a photolithographic system. Methods in accordance with the present invention allow for the separation of the contribution of the illumination optical subsystem and the projection optical subsystem of a photolithographic system with respect to ACLV (Across Chip Line-width Variation).

The present invention utilizes, among other things, images which are sensitive to partial coherence variations or sigma variations. While a variety of shapes for such images can be formed, for simplicity and ease of explanation hereinafter, these images are referred as Sigma Sensitive Parameter images (SSP) regardless of the actual nature of the image employed. It will also be understood that together with being sensitive to sigma variations, the images and the technique used to measure the images are not significantly influenced by other uncontrollable (or difficult to control) factors or parameters of the lithographic system such as optical aberrations.

The present invention also utilizes images tailored for line-width or critical dimension measurements. While a variety of shapes for such critical dimension sensitive images can be formed, for simplicity and ease of explanation hereinafter, regardless of the actual shape employed these images will be referred to as Critical Dimension Marks (CDM).

Some embodiments in accordance with the present invention provide for determining a relationship between the partial coherence factor (PCF or $\sigma$) of a photolithographic system and the size of CDMs across an image or exposure field ($CDM=f_1(PCF)$). In some embodiments, sigma sensitive parameter images are employed to determine a relationship between the SSPs and PCF or $\sigma$ values across an image field (SSP=$f_2$(PCF)) In those embodiments where these two relationships are employed, the CDMs and SSPs are evaluated at various locations across the image field at each of a variety of illumination conditions. In this manner a relationship between CDM and SSP (CDM=$f_3$(SSP)) can be determined for the specific photolithographic tool employed.

In other embodiments, simulations described in the above referenced related application are employed for determining CDM=$f_1$(PCF) and SSP=$f_2$(PCF). In this manner CDM=$f_3$(SSP) is determined without the need for exposing images at a variety of illumination conditions and measuring those images.

In some embodiments of the present invention, images tailored for CD measurements, CDMs, are formed at a plurality of locations within an exposure field utilizing a predetermined illumination condition. Using the same illumination condition, sigma sensitive images are formed at a plurality of locations within an exposure field such that each location for a SSP has a corresponding location for a CDM.

Once formed, each mark is evaluated and a value for each CDM or SSP appropriately determined. In some embodiments, sigma sensitive parameter images are formed in a manner such that the images are evaluated utilizing measurement capability encompassed by the photolithographic system. Thus, SSPs formed in accordance with some embodiments of the present invention can utilize pre-existing metrology functions included in lithographic systems to perform measurements used for alignment systems to align the overlay of mask image onto a pre-existing image on a substrate. In some embodiments, CDM and/or SSP measured values are determined using stand-alone measurement systems, for example a scanning electron microscope measurement system.

In accordance with the present invention, one location of the plurality of locations where CDM and SSP images are formed is selected as a reference location. Utilizing this reference location, a difference CDM value ($\Delta$CDM) and a difference SSP value ($\Delta$SSP) is obtained for each location. Thus, while each location other than the reference location can have a non-zero difference value, $\Delta$CDM and $\Delta$SSP values for the reference location are, by definition, zero.

In some embodiments of the present invention, the $\Delta$CDM and $\Delta$SSP values obtained for each measured location are plotted as percent $\Delta$CDM and $\Delta$SSP, $\Delta$CDM % and $\Delta$SSP % respectively. By advantageously using the same plot to graph CDM=$f_3$(SSP) as a normalized percent function CDM$_n$ %=$f_3$(SSP $_n$ %), each location within the image field is readily evaluated against this relationship. Thus, as will be subsequently described, it has been advantageously found that $\Delta$CDM % deviation of a specific location, from CDM$_n$ %=$f_3$(SSP $_n$ %), at constant $\Delta$SSP %, is a measure of the contribution to ACLV at that point by all factors other than PCF or $\sigma$ for the photolithographic system being characterized. These other factors are known to include, among other things, aberrations in the projection optics and photoresist processing. In some embodiments, evaluations are performed utilizing alternate methods, for example, by utilizing a computer system having program code stored in system memory wherein by virtue of the program code, $\Delta$CDM % and $\Delta$SSP % values specific locations within the field are used to identify those locations having variations due to the projection optics. It will also be understood that the use of percent difference values and a % normalized function are illustrative only, and that other convenient methods for processing raw data values are possible and within the scope and spirit of the present invention.

In accordance with the above and other embodiments of the present invention, it is clear that the inventors of the instant invention have developed a novel, reliable and economical solution for characterizing a photolithographic system. Thus, at any location in the image or exposure field of a projection exposure or lithography system it is now possible to immediately determine if variations noted in critical dimension measurements are due to factors other than PCF. In addition, in some embodiments the contribution due to PCF can also be determined. Hence, those skilled in the art will readily appreciate that once ACLV is characterized in the manner of the instant invention, it is possible to adjust the exposure equipment to eliminate or minimize the variations such that they do not interfere with production.

The above and other embodiments of the present inventions, together with the attendant advantages thereof, will become clearer from a reading of the detailed description of the present invention when considered in conjunction with the drawings, of which the following is a brief description.

BRIEF DESCRIPTION OF THE DRAWINGS

The present invention may be better understood, and its numerous objects, features, and advantages made apparent to those skilled in the art by referencing the accompanying drawings. For ease of understanding and simplicity, common numbering of elements within the illustrations is employed where an element is the same between drawings.

FIG. 1 is a block diagram of a projection exposure system incorporating a preferred embodiment of the present invention;

FIG. 2 is a detailed plan view of one diamond-shaped mark used in a preferred embodiment of the present invention;

DETAILED DESCRIPTION

Figure 3:
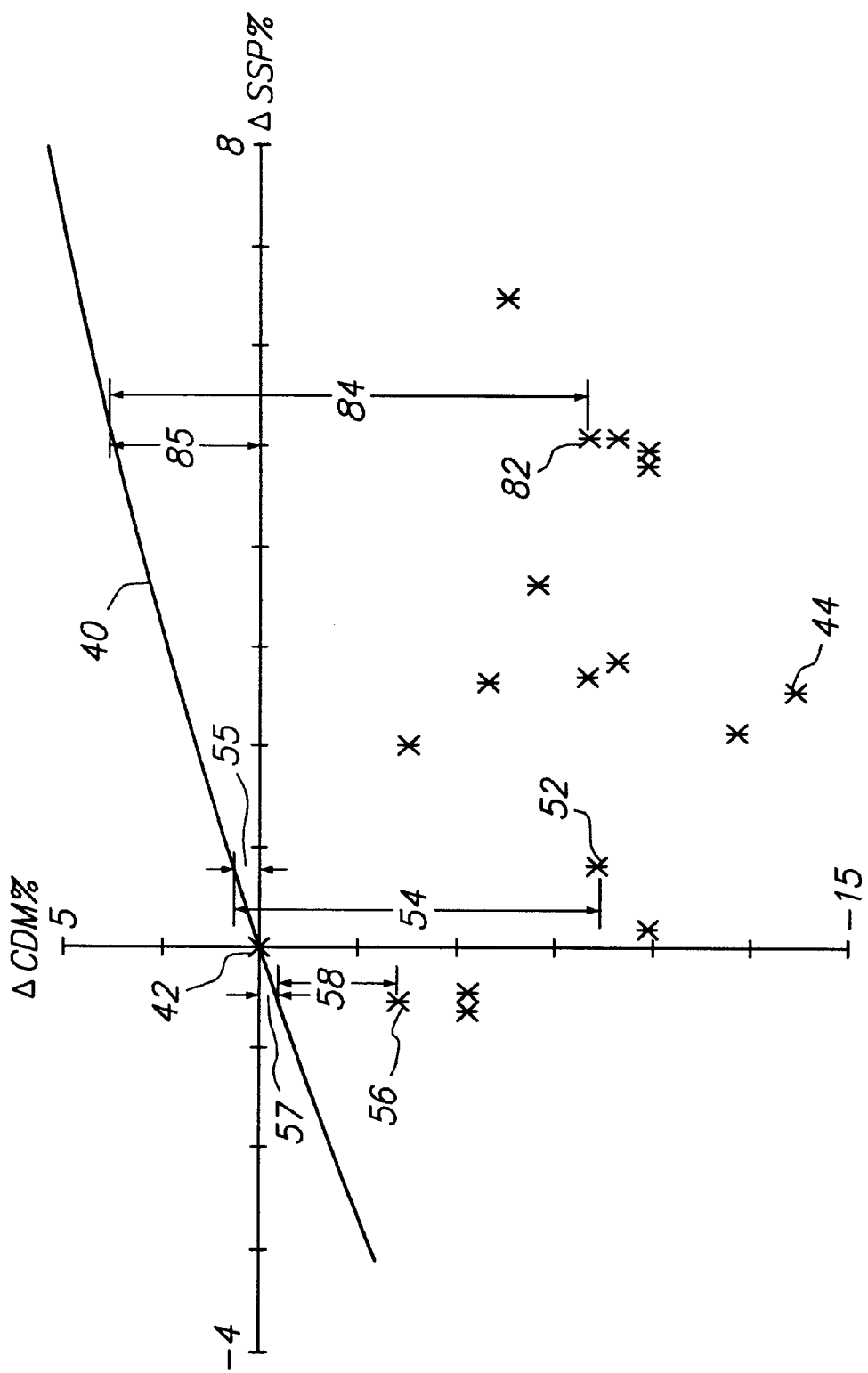
FIG. 3 shows a plot of $\Delta$CDM % versus $\Delta$SSP % and CDM$_n$ %=$f_3$(SSP $_n$ %) from a photolithographic tool before adjustment, wherein the values plotted were determined in accordance with embodiments of the present invention.

The following is a detailed description of illustrative embodiments of the present invention. As these embodiments of the present invention are described with reference to the aforementioned drawings, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings are not to be considered in a limiting sense as it is understood that the present invention is in no way limited to the embodiments illustrated.

Referring to FIG. 1, a projection exposure system 10 including an illumination source 12 is shown. As those skilled in the art will readily appreciate, the illumination source 12 may be a high pressure mercury lamp, a krypton fluoride laser (KrF), electron beam radiation source, or any other suitable illumination device or radiation source, for example an ion beam source. The illumination from source 12 passes through an illumination optical system 14. Illumination optical system 14 receives the radiation from the illumination source 12 and projects it through a mask or reticle 16. While illumination optical system 14 is illustrated in block form, it will be understood that it includes whatever suitable system for controlling the illumination of reticle 16 with the desired source of illumination that is necessary. For example, where source 12 is a high pressure mercury lamp, illumination system 14 can include a lens structure or mirror optical system.

The illumination which passes through mask 16, having a predetermined image 17 formed thereon, is then received by a projection optical system 18. Projection optical system 18 focuses image 17, received from illumination passing through the reticle 16, and produces an image 20 on a predetermined image plane 21. For example, in the production of semiconductor devices utilizing a high pressure mercury lamp as the light source, a substrate (not shown) having a photosensitive material layered thereon would be placed in image plane 21. The photosensitive material would then be exposed in accordance with the image 17 on the mask 16 to form image 20 on the substrate.

In embodiments of the present invention, image 20 incorporates a series of diamond-shaped marks having a length 22. While embodiments in accordance with the present invention are not limited to utilizing the diamond-shaped marks illustrated by image 20, such diamond-shaped marks have been advantageous found to be particularly sensitive to variations in the partial coherence factor or PCF.

In particular, referring to FIG. 2, a detailed plan view of a diamond-shaped mark 24 used in accordance with some embodiments of the present invention is shown. As shown, diamond-shaped mark 24 is representative of any of the diamond-shaped marks of image 20 seen in FIG. 1. It has been found that pointed ends 26 of mark 24, which dictate the length 30 and angle 28 of mark 24, are very sensitive to changes in the parameters of the projection system. In this manner, when mark 24 is utilized in a system having known performance parameters (e.g. NA and illumination power), variations in projections of mark 24 have been found to be indicative of changes in partial coherence values or σ.

Diamond-shaped marks have been used in the past for alignment purposes to align layers in semiconductor fabrication as well as to determine the optimum focus position for photolithography tools. An example of a system utilizing such marks can be seen in U.S. Pat. No. 4,908,656, entitled "METHOD OF DIMENSION MEASUREMENT FOR A PATTERN FORMED BY EXPOSURE APPARATUS, AND METHOD FOR SETTING EXPOSURE CONDITIONS AND FOR INSPECTING EXPOSURE PRECISION" which patent is incorporated herein by reference. The alignment system utilized in the '656 patent employs a system known as a laser step alignment ("LSA") system which utilized as laser to automatically detect and measure with high precision the length of the diamond-shaped marks 24. It has been advantageously determined that such measurement, in addition to be used for alignment purposes by the LSA system, can also be used to determine PCF variations across the exposure field of the exposure apparatus. The LSA system is capable of automatically detecting and measuring the length of diamond-shaped marks 24. In the typical LSA system, the four diamond-shaped marks 24 would be repeated in groups of eight, with each group of four wedge marks being spaced by 8 μm to satisfy the diffraction requirement of the LSA alignment system. Of course, embodiments in accordance with the present invention are not limited to use with four diamond-shaped marks or the diamond-shaped mark in particular, but rather a mark of any shape found to have measurable variations indicative of changes in partial coherence values is appropriate.

Referring again to FIG. 2, the length to width ratio of the diamond-shaped mark 24 is typically on the order of 20:1, but is not limited to this ratio. Hence, for a typical application, width 32 is approximately 0.5 μm and length 30 is typically approximately 10 μm. By utilizing such a large scale length to width ratio, it has been found that embodiments of the present invention avoid sensitivity to uncontrollable factors such as optical aberrations, deviations in the focusing position of a projection apparatus, characteristics of the photoresist and other such uncontrollable or difficult to control parameters.

The size of the diamond-shaped marks 24 discussed above produces a preferred angle 27 of approximately two (2) to five (5) degrees at point 26 of mark 24 and an overall angle 28 in the range of approximately 4° to 10°. While marks having an overall angle 28 in this range have been advantageously found to provide enhanced sensitivity to sigma variations for use with embodiments of the present invention the present invention is in no way limited to utilizing marks having such an overall angle 28. Those skilled in the art will appreciate that marks having other angles may be utilized without departing from the spirit or scope of the present invention. It should be noted that while it appears that as the size of angle 28 decreases the sensitivity of mark 24 to sigma variations increases, current photoresist technology yields a preferred angle in the above range 4° to 10° range due to the greater reliability of measurement data from images having such characteristics.

Further, it has advantageously been found that by projecting a large scale mark such as diamond-shaped mark 24, the length of the mark projected by the projection exposure system is directly dependent on the partial coherence factor. Since it is possible to accurately and reliably measure the length of such large marks 24 using, for example, the LSA system discussed above, it is advantageously possible to utilize such measurements to determine the partial coherence or sigma variations across the imaging field without requiring additional equipment or tools for such tasks. Thus it is seen that in some embodiments of the present invention the length of diamond-shaped mark 24 is a sigma sensitive parameter (SSP).

Those skilled in the art will readily appreciate that it is not a requirement of the present invention that diamond shaped marks, and in particular groups of four such marks, be utilized with the present invention as SSP. Any number of marks or any shape of mark determined to be sensitive to PCF variation can be utilized with embodiments of the present invention for SSP provided that a suitable measurement can be easily and reliably obtained. The number of marks used will depend on, for example, the resolution and sensitivity of the measurement tool which is utilized.

In other embodiments of the present invention a correlation between sigma and deviations in the image size caused by proximity effects is utilized to determine PCF or σ for an exposure system. Proximity effects occur when, for example, densely packed features in the image are not projected with the same dimensions as isolated features. As it is known that at a given distance between features, the difference in feature size depends on numerical aperture and sigma, where numerical aperture is known, σ is readily evaluated. Thus as described by J. Borodovsky in *"Impact of*

*Local Partial Coherence Variations on Exposure Tool Performance*", Optical/Laser Microlithography, Proc. SPIE, vol. 2440, P. 750–70 (1995), (hereinafter Borodovsky), a photoresist layer is first exposed using a reticle having a plurality of lines of equal line-width but where the spacing or pitch of the lines is varied across the plurality of lines. The photoresist is then developed and the critical dimension or line-width for each line measured and plotted against the pitch. The data is then fitted with a computer simulated curve which uses σ or PCF as a variable parameter. The best fit simulated curve then expresses the exposure system's PCF or σ. Thus, the plurality of lines of Borodovsky provides another SSP that can be evaluated.

Turning now to FIG. 3, a plot of ΔSSP % versus ΔCDM % and $CDM_n$ %=$f_3$ ($SSP_n$ %), in accordance with embodiments of the present invention, is shown for a photolithographic tool. Each location of the plurality of locations is shown as a point having a value of (ΔSSP %, ΔCDM %). ΔSSP % and ΔCDM % are each a percent difference value obtained by evaluating the absolute difference between the CDM or SSP value for a specific location and the appropriate value for a reference location selected, as previously described. These absolute difference values, $CDM_{act}$-$CDM_{ref}$ and $SSP_{act}$-$SSP_{ref}$, are then transformed into percent differences as a convenient method for eliminating any effect due to the actual values of the measured parameters. In this manner, comparisons between different exposure tools and processes can be readily made. Thus ΔSSP % and ΔCDM % as described above are normalized values. As shown, point 42 is located at the origin of the coordinate system of FIG. 3; thus representing the reference point used to evaluate ΔCDM and ΔSSP. Another point or location 44 is seen as having the maximum absolute value for ΔCDM % of any point or location of the plurality of locations plotted. This maximum variation is seen as being approximately 15%; hence the total variation of critical dimension values seen is to be approximately ±7.5%.

It will be readily understood by one of ordinary skill in the art, that such a normalization process is not a requirement of the present invention; nor is the specific normalization method described above the only such method that can be used. Therefore, both the scope and spirit of the present invention encompass using any method to normalize absolute values, as well as the use of the absolute values themselves.

Still referring to FIG. 3, function line 40 represents the relationship $CDM_n$ %=$f_3$($SSP_n$ %) for the specific tool to be characterized. As previously mentioned, in some embodiments of the present invention, $CDM_n$ %=$f_3$($SSP_n$ %), as represented by line 40, is derived by determining a relationship between the partial coherence factor (PCF or σ) of a photolithographic tool and the size of critical dimension marks (CDMs) across an image or exposure field, as represented by the function CDM=$f_1$(PCF). In some embodiments, physical measurements are made of CDMs at a variety of illumination conditions to determine CDM=$f_1$(PCF) for the image field. A second relationship, SSP=$f_2$(PCF), is also determined wherein a parameter of a sigma sensitive parameter image is evaluated within the image field at each of the same illumination conditions used to determine first function CDM=$f_1$(PCF). In this manner, CD variation and PCF or a variation for the image field of the photolithographic tool are determined. Where these two relationships are evaluated, a third relationship, CDM=$f_3$(SSP), is then calculated to express CD variation as a function of PCF variation. Finally, this third relationship, CDM=$f_3$(SSP), is normalized to yield $CDM_n$ %=$f_3$($SSP_n$ %) and plotted as line 40. As discussed with respect to ΔSSP % and ΔCDM %, the method used to normalize CDM=$f_3$ (SSP) is not critical to the practice of embodiments of the present invention. Thus, any appropriate normalization method, or no normalization method at all, can be employed, provided that the normalization method selected, if any, is consistently applied. Thus in some embodiments of the present invention, it has been found advantageous to provide a normalized function line 40, wherein the value of the function is normalized as $$\left(\left(\frac{SSP_{act} - SSP_{ref}}{SSP_{ref}}\right) \times 100\right), \left(\left(\frac{CDM_{act} - CDM_{ref}}{CDM_{ref}}\right) \times 100\right).$$

It will be understood that in addition to the above method for determining CDM=$f_3$(SSP), that is by performing measurements to first evaluate CDM=$f_1$(PCF) and SSP=$f_2$(PCF), other methods are also possible. For example, simulations, as described in the related '375 application, referenced above, can be employed for determining CDM=$f_1$(PCF) and SSP=$f_2$(PCF). In this manner, the need for exposing images and measuring critical dimensions or sigma sensitive parameters is eliminated. Where simulations are employed, CDM=$f_3$(SSP) is then determined using these calculated or simulated relationships. It will also be understood, that where actual measurements of a sigma sensitive parameter (SSP) are made, that the length of diamond-shaped mark 24 (FIG. 2) is only one such mark for determining SSP values. Thus other methods and or other marks, for example the method and marks of Borodovsky, can also be employed to determine SSP values.

Still referring to FIG. 3, two points 52 and 56 representing two locations in the exposure field are shown at distances 54 and 58, respectively, from function line 40. As seen, each distance 54 and 58 is in the direction of ΔCDM % and each represents the normalized variation in critical dimension value from that predicted by function line 40. Thus, as function line 40 encompasses only the expected variation due to PCF or σ, each distance 54 and 58 is representative of a variation due to other imaging factors. While, as previously mentioned, there are a number of other factors that contribute to this variation, it has advantageously been found that a photolithographic tool's projection optics system 18 (FIG. 1) makes the most significant contribution. Hence, adjustment of projection optics 18 can be used to reduce each distance 54 and 56.

Distance 55 is shown for point or location 52 as a ΔCDM % variation from the ΔSSP % axis or a ΔCDM % value of zero to function line 40. As function line 40 represents an expected ΔCDM % variation due to PCF or σ, distance 55 is then representative of the magnitude of that expected variation. Thus, any contribution of factors other than PCF that result in the actual variation represented by distance 54, that is factors that have reduced ΔCDM % for that location to below zero, have necessarily overcome the contribution of PCF as represented by distance 55. In comparison, for location 56, both the ΔCDM % value of function line 40 for that location and the ΔCDM % value of location 56 are below zero. Thus, distance 57, shown as the variation of line 40 from zero, is indicative that PCF contributes to reduce ΔCDM %, and that the total ΔCDM % variation of location 56, represented as distance 58, is the sum of PCF and other factors. Thus in some embodiments of the present invention, characterization of a photolithographic tool provides for separating the relative contribution to variations in critical dimensions of PCF or a from other factors to tailor the magnitude of the adjustment of those other factors that is required. Comparing point or location 82 to location 52 is illustrative that two locations having similar absolute ΔCDM %. (both approximately 8%) can require different magnitudes of adjustment. Thus, distance 84 is larger than distance 54, by an amount equal to the difference in distances 55 and 85, or the expected increase in absolute critical dimension due to PCF for each location 52 and 82, respectively.

Figure 4:
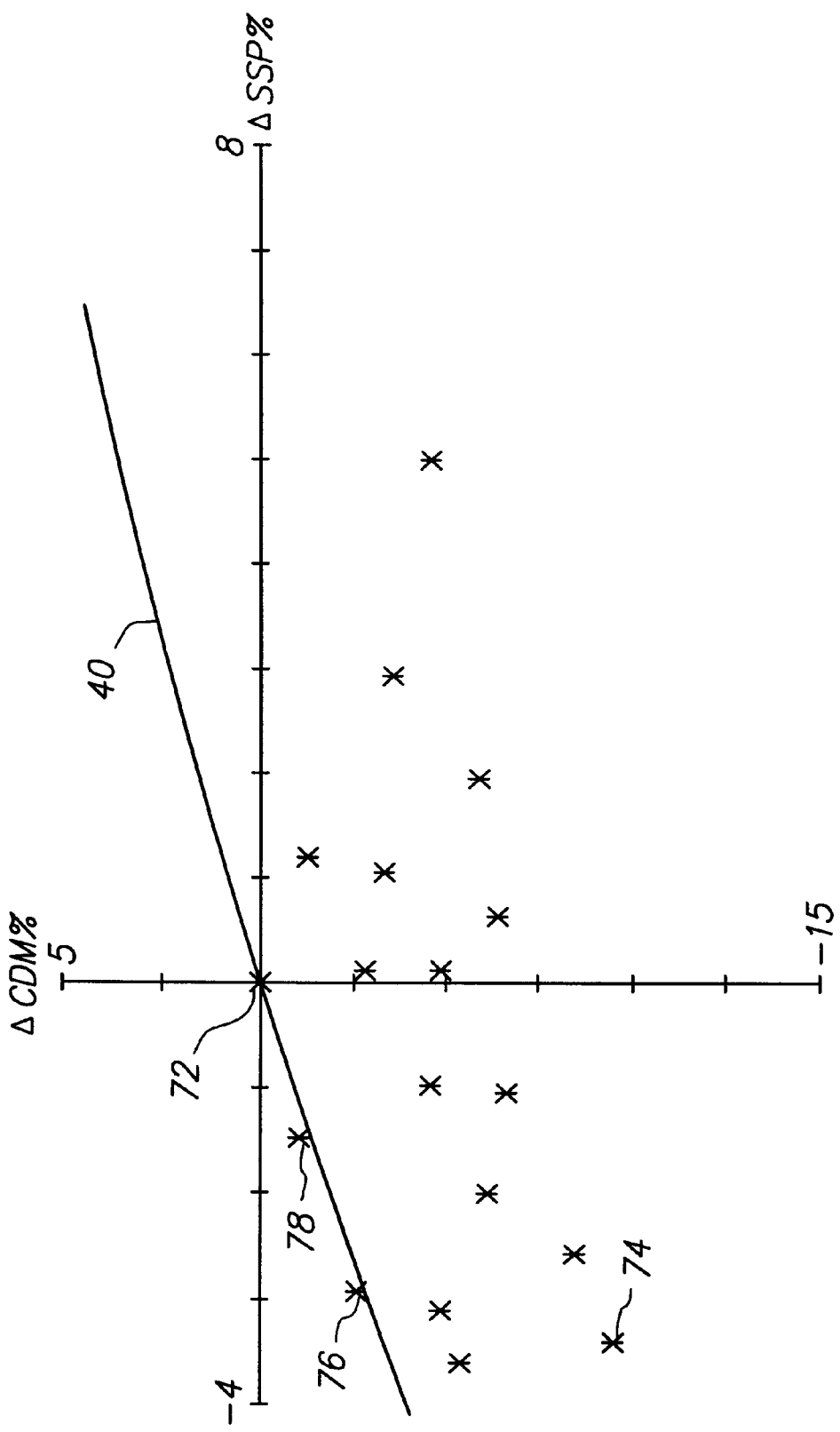
FIG. 4 shows a plot of $\Delta$CDM % versus $\Delta$SSP % and CDM$_n$ %=$f_3$(SSP $_n$ %) from the photolithographic tool of FIG. 3 after adjustment, wherein the values plotted were determined in accordance with embodiments of the present invention.

Turning now to FIG. 4, a plot of the plurality of locations shown in FIG. 3 is seen after an adjustment of projection optics system 18 (FIG. 1) and re-evaluation of ΔSSP % and ΔCDM % for each location is completed. Function line 40 representing $CDM_n \% = f_3(SSP_n \%)$ is again indicated. It is readily seen that as a result of the aforementioned adjustment, the distribution of ΔSSP %, ΔCDM % values is changed from that of FIG. 3. Location 74 is seen to have the maximum ΔCDM % variation from reference location 72, which is reduced from that of location 44 (FIG. 3) to less than approximately 10°. Thus the total variation of the plurality of locations after adjusting projection optics system 18 is less than approximately ±50%.

Still referring to FIG. 4, one of ordinary skill in the art will readily realize that two locations, points 76 and 78 are above function line 40. While in FIG. 3, no locations had ΔSSP %, ΔCDM % values above function line 40, such values are possible and are sometimes common. Thus the absolute value of any variation is used to indicate the magnitude of adjustment required. It should also be realized that for points that fall above function line 40, that the distance from line 40 to the ΔSSP % axis is representative of the contribution of PCF or σ to the absolute variation of ΔCDM % from zero.

It should now be realized that methods of characterizing a projection photolithographic system have been presented that provide for the separation of the effects of the Partial Coherence Factor or Sigma from other factors that effect exposure tool performance across an exposure field. Thus methods in accordance with the present invention provide for information that can be used to reduce Across Chip Line-width Variation (ACLV) and to enhance microelectronic photolithography and production.

It should also be realized that embodiments of the present invention are not in any way limited to the illustrative methods described in FIGS. 1 through 4. Rather, other methods not requiring plotting are within the scope and spirit of the present invention. Thus, for example, program code for evaluation of ΔCDM % and ΔSSP % and the differences between these values and ΔCDM %=$f_3$(ΔSSP %) can be advantageously employed using a general purpose computer, where such a computing device is a stand-alone system or is incorporated with the photolithographic system. In addition, such program code can be advantageously used to evaluate non-normalized data and functions as well as data and functions normalized using methods other than those described herein. Additionally, as an alternative to a general purpose computer, an application specific computing device can be employed. For example, an application specific computer having program code incorporated into a Read Only Memory device.

Finally, it will be understood that embodiments of the present invention include photolithographic tools that encompass devices for measuring some or all of the values required to determine CDM=$f_3$(SSP) and in some embodiments for determining CDM=$f_3$(SSP) and the other functions described hereinbefore. Also, embodiments in accordance with the present invention encompass photolithographic tools or systems that can have their performance enhanced by the adjustments described hereinbefore. Thus in some embodiments of the present invention, photolithographic tool performance is enhanced by adjustments to projection optics systems and/or illumination optics systems as determined by the methods described hereinbefore.

We claim:

1. A method for characterizing performance of a photolithography system, comprising the acts of:

exposing at least one image of a critical dimension mark on a photosensitive material on a substrate using the photolithography system, whereby the critical dimension mark is tailored for line width or critical dimension measurement of the photolithography system;

exposing at least one sigma sensitive parameter image on the photosensitive material using the photolithography system, whereby the sigma sensitive parameter image is sensitive to partial coherence variation or sigma variations of the photolithography system, and wherein the acts of exposing use the same exposure conditions, wherein each of a plurality of locations for the sigma sensitive parameter image has a corresponding location for the image of the critical dimension mark;

selecting a reference location of the exposed critical dimension mark image and the sigma sensitive image;

for each of the plurality of locations and the reference location for the sigma sensitive parameter exposed image, measuring a value;

for each of the plurality of corresponding locations and the reference location for the exposed image of the critical dimension mark, measuring a value;

determining for each of the plurality of locations for the sigma sensitive parameter image, a difference between the measured value and the measured value at the reference location;

determining for each of the plurality of locations for the image of the critical dimension mark, a difference between the measured value and the measured value at the reference location, whereby a relationship at each location between the difference for the sigma sensitive parameter image and the corresponding difference value for the image of the critical dimension mark characterizes the photolithography system.

2. The method of claim 1, wherein the acts of measuring are performed using a metrology function in the photolithography system or a stand alone measurement system.

3. The method of claim 1, wherein the sigma sensitive parameter images are elongated diamonds.

4. The method of claim 1, further comprising the act of analyzing the differences thereby to determine their relationship to each location.

5. A photolithographic system adjustable for enhanced performance by the method of claim 1.

* * * * *